(12) United States Patent
Mellot et al.

(10) Patent No.: US 10,416,294 B2
(45) Date of Patent: Sep. 17, 2019

(54) RANGING DEVICE READ-OUT CIRCUIT

(71) Applicants: STMicroelectronics (Research & Development) Limited, Marlow (GB); STMicroelectronics (Grenoble 2) SAS, Grenoble (FR)

(72) Inventors: Pascal Mellot, Lans en Vercors (FR); Stuart McLeod, Edinburgh (GB); Marc Drader, Colombelles (FR)

(73) Assignees: STMicroelectronics (Research & Development) Limited, Marlow (GB); STMicroelectronics (Genoble 2) SAS, Grenoble (FR)

( * ) Notice: Subject to any disclaimer, the term of this patent is extended or adjusted under 35 U.S.C. 154(b) by 436 days.

(21) Appl. No.: 15/169,464

(22) Filed: May 31, 2016

(65) Prior Publication Data

US 2017/0139040 A1    May 18, 2017

(30) Foreign Application Priority Data

Nov. 16, 2015 (FR) ...................................... 15 60947

(51) Int. Cl.
| | |
|---|---|
| *G01S 7/48* | (2006.01) |
| *G01S 7/486* | (2006.01) |
| *G01S 17/10* | (2006.01) |
| *H01L 27/144* | (2006.01) |

(Continued)

(52) U.S. Cl.
CPC .......... *G01S 7/4863* (2013.01); *G01S 7/4914* (2013.01); *G01S 7/4915* (2013.01); *G01S 17/10* (2013.01); *G01S 17/36* (2013.01); *H01L 27/1446* (2013.01)

(58) Field of Classification Search
CPC ........ G01S 17/10; G01S 17/026; G01S 17/36; G01S 7/4865; G01S 7/497
See application file for complete search history.

(56) References Cited

U.S. PATENT DOCUMENTS

| | | | |
|---|---|---|---|
| 9,786,701 B2 | 10/2017 | Mellot et al. | |
| 2006/0202129 A1* | 9/2006 | Niclass | G01T 1/248 |
| | | | 250/370.14 |
| 2011/0157354 A1 | 6/2011 | Kawahito | |

(Continued)

FOREIGN PATENT DOCUMENTS

EP    2 541 219 A1    1/2013

OTHER PUBLICATIONS

U.S. Appl. No. 15/169,489, filed May 31, 2016, Ranging Device with Imaging Capability.

(Continued)

*Primary Examiner* — Luke D Ratcliffe
(74) *Attorney, Agent, or Firm* — Seed IP Law Group LLP

(57) ABSTRACT

A ranging device includes an array of photon detection devices that receive an optical signal reflected by an object in an image scene and first and second logic devices to respectively combine the outputs of first and second pluralities of the photon detection devices. First and second counter circuits are respectively coupled an output of the first and second logic devices and generate first and second count values respectively by counting the photon detection events generated by the first and second pluralities of photon detection devices. A range estimation circuit estimates the range of the object by estimating the timing of one or more pulses of said optical signal based on the first and second count values.

18 Claims, 6 Drawing Sheets

(51) Int. Cl.
  *G01S 17/36*  (2006.01)
  *G01S 7/491*  (2006.01)

(56) References Cited

U.S. PATENT DOCUMENTS

| | | |
|---|---|---|
| 2012/0249998 A1 | 10/2012 | Eisele et al. |
| 2013/0077082 A1 | 3/2013 | Mellot |
| 2013/0175435 A1 | 7/2013 | Drader |
| 2014/0016879 A1 | 1/2014 | Högasten et al. |
| 2014/0021356 A1* | 1/2014 | Zwaans ................ G01T 1/2985 250/362 |
| 2014/0231631 A1* | 8/2014 | Moore .................... G01S 17/10 250/214.1 |
| 2015/0177369 A1 | 6/2015 | Kostamovaara |
| 2015/0312489 A1 | 10/2015 | Hoelter et al. |

OTHER PUBLICATIONS

Gersbach et al., "A Parallel 32x32 Time-To-Digital Converter Array Fabricated in a 130 nm Imaging CMOS Technology," IEEE Proceedings of ESSCIRC, Athens, Sep. 14-18, 2009, 4 pages.

Niclass et al., "A 128x128 Single-Photon Imager with on-Chip Column-Level 10b Time-to-Digital Converter Array Capable of 97ps Resolution," ISSCC 2008, Session 2, Image Sensors & Technology, 2.1, IEEE International Solid-State Circuits Conference, 2008, 3 pages.

Walker et al., "A 128x96 Pixel Event-Driven Phase-Domain ΔΣ-Based Fully Digital 3D Camera in 0.13μm CMOS Imaging Technology," ISSCC 2011, Session 23, Image Sensors, 23.6, IEEE International Solid-State Circuits Conference, 2011, 3 pages.

* cited by examiner

RANGING DEVICE READ-OUT CIRCUIT

This application claims the priority benefit of French Patent application number 15/60947, filed on Nov. 16, 2015, the contents of which is hereby incorporated by reference in its entirety to the maximum extent allowable by law.

BACKGROUND

Technical Field

The present disclosure relates to the field of ranging based on a time of flight calculation, and in particular to a read-out circuit of a ranging device.

Description of the Related Art

SPAD (single-photon avalanche diode) arrays can be used for a variety of applications, including for ranging, for Z or 3D gesture recognition and for 3D imaging. A device for such applications generally comprises a light source for transmitting an optical pulse into the image scene. The light reflected back from any object in the image scene is detected by the SPAD array, and used to determine the time of flight of the optical pulse. The distance from the object to the device can then be deduced based on this time of flight.

The detection by the SPAD array of the returning optical pulse is based on event detection in the cells of the SPAD array. In particular, each cell will provide an output pulse when a photon is detected, and by monitoring the events, the arrival time of the return pulse can be estimated.

A difficulty in such an event-driven system is that under very high ambient light and/or with a very reflective and/or close target, there may be a high number of events to be captured and processed in a short time frame, leading to congestion. Indeed, it would be inefficient and demanding on processing resources to perform range estimation based on the output of each SPAD cell. Therefore, the output of multiple SPADs are combined and processed as one signal. However, such a solution is limited by the devices used to combine the SPAD outputs, as these devices tend to become overloaded, leading to measurement inaccuracy.

BRIEF SUMMARY

It is an aim of embodiments of the present description to at least partially address one or more problems in the prior art.

According to one aspect, there is provided a ranging device comprising: an array of photon detection devices adapted to receive an optical signal reflected by an object in an image scene; a first logic device adapted to combine the outputs of a first plurality of the photon detection devices; a first counter circuit coupled to an output of the first logic device and adapted to generate a first count value by counting the photon detection events generated by the first plurality of photon detection devices; a second logic device adapted to combine the outputs of a second plurality of the photon detection devices; a second counter circuit coupled to an output of the second logic device and adapted to generate a second count value by counting the photon detection events generated by the second plurality of photon detection devices; and a range estimation circuit adapted to estimate the range of the object by estimating the timing of one or more pulses of said optical signal based on the first and second count values.

According to one embodiment, the first counter circuit is adapted to generate the first count value by counting the photon detection events generated by the first plurality of photon detection devices during a first time window, and to generate a third count value by counting the photon detection events generated by the first plurality of photon detection devices during a second time window consecutive to the first time window; the second counter circuit is adapted to generate the second count value by counting the photon detection events generated by the second plurality of photon detection devices during the first time window and to generate a fourth count value by counting the photon detection events generated by the second plurality of photon detection devices during the second time window.

According to one embodiment, the ranging device further comprises: a first adder adapted to add the first and second count values to generate a first combined count value; and a second adder adapted to add the third and fourth count values to generate a second combined count value, the range estimation circuit being adapted to determine the timing of the one or more pulses based on the first and second combined count values.

According to one embodiment, the range estimation circuit is adapted to calculate the difference between the first and second combined count values, and to determine the timing of the one or more pulses based on said difference.

According to one embodiment, the range estimation circuit comprises a sigma-delta phase detector.

According to one embodiment, the ranging device further comprises: an optical transmitter adapted to transmit the optical signal towards the object in the image scene.

According to one embodiment, the first and second logic devices are OR trees.

According to one embodiment, the photon detection devices are SPAD (single-photon avalanche diode) devices.

According to a further aspect, there is provided a method comprising: receiving, by an array of photon detection devices, an optical signal reflected by an object in an image scene; combining, by a first logic device, the outputs of a first plurality of the photon detection devices; generating, by a first counter circuit coupled to an output of the first logic device, a first count value by counting the photon detection events generated by the first plurality of photon detection devices; combining, by a second logic device, the outputs of a second plurality of the photon detection devices; generating, by a second counter circuit coupled to an output of the second logic device, a second count value by counting the photon detection events generated by the second plurality of photon detection devices; and estimating, by a range estimation circuit the range of the object by estimating the timing of one or more pulses of the optical signal based on the first and second count values.

According to one embodiment, generating the first count value comprises counting the photon detection events generated by the first plurality of photon detection devices during a first time window and generating the second count value comprises counting the photon detection events generated by the second plurality of photon detection devices during the first time window, the method further comprising: generating a third count value by counting the photon detection events generated by the first plurality of photon detection devices during a second time window consecutive to the first time window; and generating a fourth count value by counting the photon detection events generated by the second plurality of photon detection devices during the second time window.

According to one embodiment, the method further comprises: adding the first and second count values to generate a first combined count value; and adding the third and fourth count values to generate a second combined count value, determining the timing of the one or more of pulses being based on the first and second combined count values.

According to one embodiment, the method further comprises calculating the difference between the first and second combined count values, and determining the timing of the one or more pulses based on said difference.

According to one embodiment, the method further comprises: transmitting, by an optical transmitter, the optical signal towards the object in the image scene.

According to one embodiment, the optical signal is: a square-wave signal; or a sinewave signal; or a triangle wave signal; or a sawtooth wave signal.

BRIEF DESCRIPTION OF THE SEVERAL VIEWS OF THE DRAWINGS

The foregoing and other features and advantages will become apparent from the following detailed description of embodiments, given by way of illustration and not limitation with reference to the accompanying drawings, in which.

DETAILED DESCRIPTION

Throughout the present description, the term "connected" is used to designate a direct electrical connection between two elements, whereas the term "coupled" is used to designate an electrical connection between two elements that may be direct, or may be via one or more other components such as resistors, capacitors or transistors. Furthermore, as used herein, the term "around" is used to designate a range of +/−10 percent of the value in question.

While in the present description embodiments are described comprising a ranging device in the form of a SPAD array, the principles of the circuit and method described herein for calculating a distance to an object could be applied to arrays formed of other types of photon detection devices.

Figure 1:
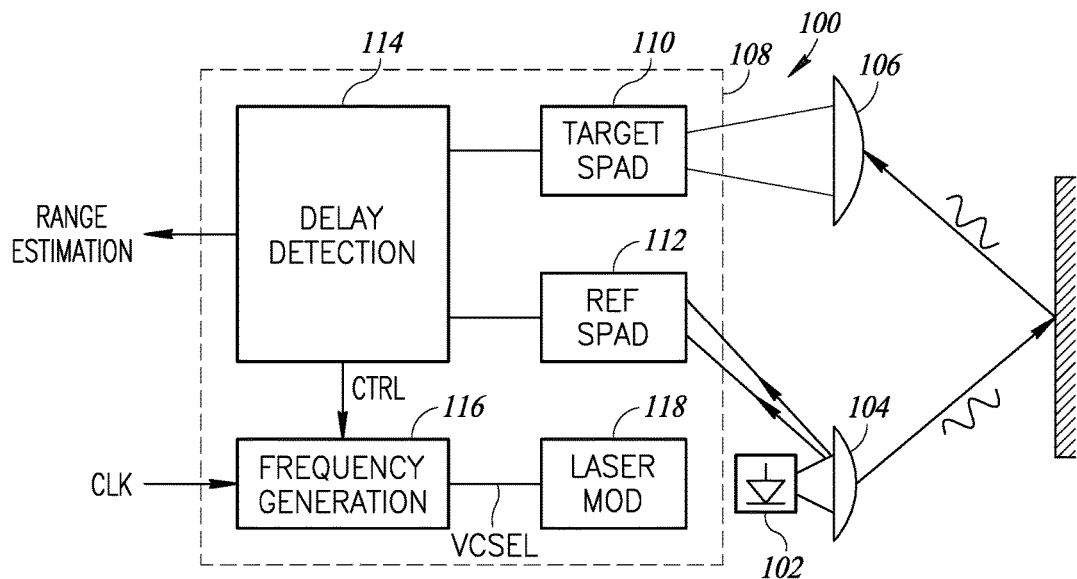
FIG. 1 schematically illustrates a ranging device according to an example embodiment of the present disclosure.

FIG. 1 schematically illustrates a ranging device 100 implementing a ranging function. The device 100 comprises a light source 102, which is for example a laser, for generating an optical signal, formed for example of a beam of optical pulses, transmitted into the image scene, for example via a lens 104. The return optical pulses are for example received via a further lens 106.

The ranging device 100 further comprises a range estimation circuit 108 for estimating the distance between the device 100 and an object in the image scene against which the optical pulses reflect. The range estimation circuit 108 for example comprises a target SPAD array (TARGET SPAD) 110, which receives the return optical pulses via the lens 106. The target SPAD array 110 for example comprises an array of between 4 and several hundred SPAD cells.

The range estimation circuit 108 also for example comprises a reference SPAD array (REF SPAD) 112, which is for example of the same dimensions or of smaller dimensions than the target SPAD array 110, and receives an internal reflection of the transmitted optical pulses. In some embodiments, the reference SPAD array is a mono-dimensional array, for example having only a row or column of SPAD cells.

A delay detection circuit (DELAY DETECTION) 114 is for example coupled to the target SPAD array 110 and to the reference SPAD array 112, and estimates the delay between each transmitted optical pulse and the return optical pulse received by the target SPAD array 110, in order to provide a range estimation (RANGE ESTIMATION) of the object. The range estimation circuit 108 also for example comprises a frequency generation circuit (FREQUENCY GENERATION) 116, which generates a voltage signal VCSEL provided to a laser modulation circuit (LASER MOD) 118 for generating a signal for driving the light source 102. The delay detection circuit 114 for example provides a control signal CTRL to the frequency generation circuit 116 for controlling the period of the signal VCSEL.

Figure 2:
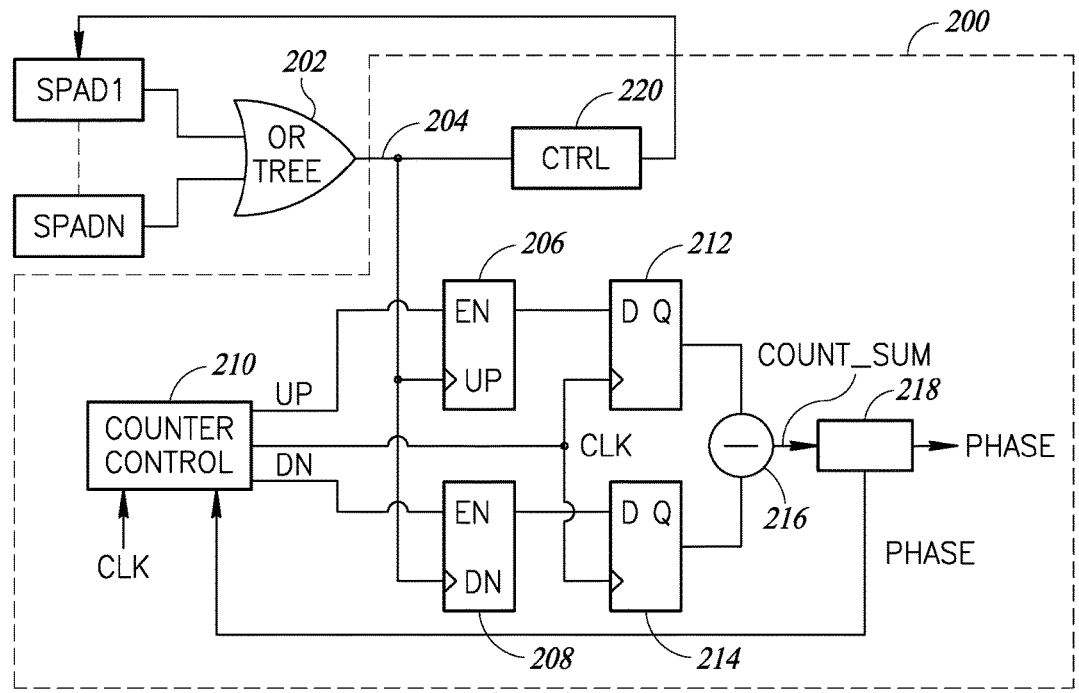
FIG. 2 schematically illustrates a delay detection circuit of FIG. 1 in more detail according to an example embodiment.

FIG. 2 schematically illustrates a circuit 200 forming part of the delay detection circuit 114 of FIG. 1 in more detail according to an example embodiment in which the outputs of all of the SPAD cells of the target SPAD array 110 are combined onto a single line. In particular, the circuit 200 for example comprises an OR tree (OR TREE) 202 having inputs respectively coupled to each of the SPAD cells SPAD1 to SPADN of the array 110, and providing, on its output line 204, pulses generated each time an event is detected by any of the SPAD cells.

The output line 204 is coupled to counters for counting the detected events. In the example of FIG. 2, the output line 204 is coupled to the clock input of an up counter (UP) 206 and of a down counter (DN) 208. The up counter 206 is enabled during an up count period, based on a signal UP received from a counter control circuit (COUNTER CONTROL) 210, which receives a clock signal CLK. Similarly, the down counter 208 is enabled during a down count period, based on a signal DN received from the counter control circuit 210. The output of the counter 206 is for example clocked by a flip-flop 212 based on the clock signal CLK, and the output of the counter 208 is for example clocked by a flip-flop 214 based on the clock signal CLK. A difference between the outputs of the flip-flops 212 and 214 is generated by a subtraction unit 216 to provide a signal COUNT_SUM. This signal is analyzed by a phase detection circuit 218, which is for example a sigma delta phase detector, in order to generate a phase signal (PHASE) indicating for example the timing of the center of each optical pulse received by the target SPAD array 110. The phase signal PHASE is provided to the counter control circuit 210 and used to determine the timing to be applied for a subsequent detection cycle. In particular, the phase signal is for example used to control the timing of the signals UP and DN, as will be described in more detail below.

While not illustrated in FIG. 2, the delay detection circuit 114 for example further comprises a circuit similar to the circuit 200 for generating a reference phase signal PHASE' indicating the timing of the center of each optical pulse received by the reference SPAD array 112. The delay detection circuit 114 for example estimates the time of flight of the optical pulses based on the time difference between the phase signals PHASE and PHASE'.

Figure 3:
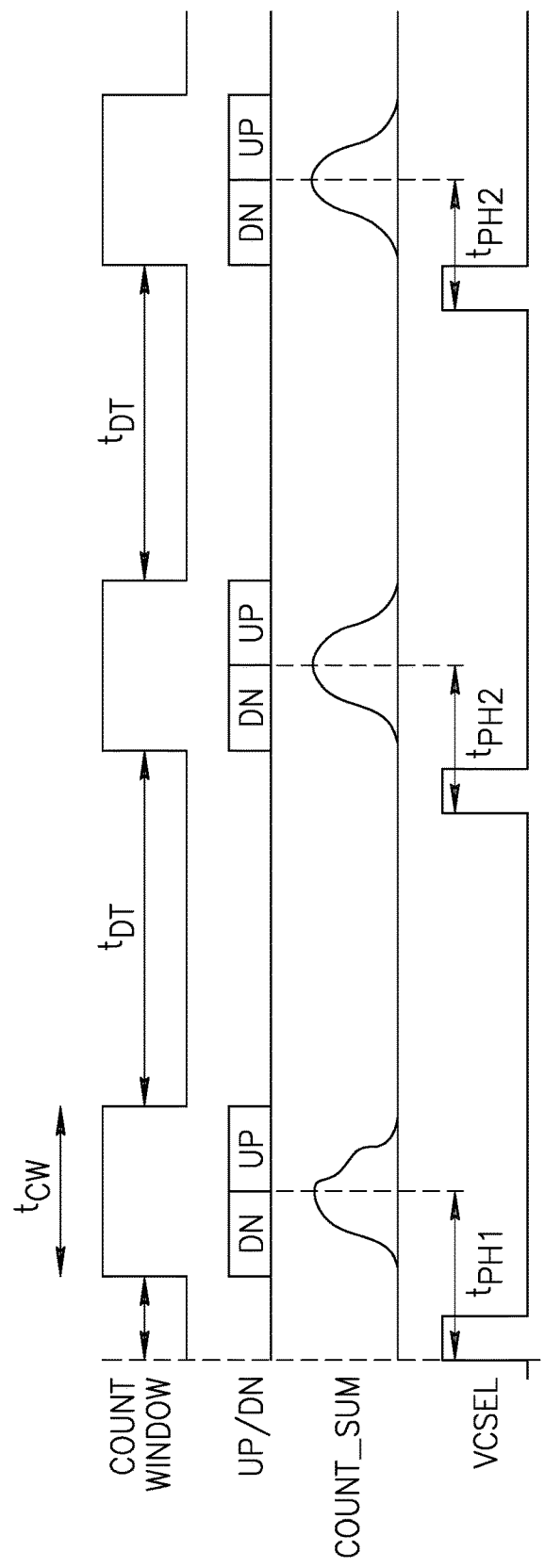
FIG. 3 is a timing diagram illustrating examples of signals in the circuit of FIG. 2 according to an example embodiment.

FIG. 3 is a timing diagram illustrating examples of a count window (COUNT WINDOW) of the counters 206, 208 of FIG. 2, and the signals DN and UP controlling the counters 206, 208, the signal COUNT_SUM and the signal VCSEL used to generate the optical pulses.

The count window for each detection phase for example has a duration $t_{CW}$, and the count windows are separated by deadtime periods of duration $t_{DT}$ during which the counters 206, 208 are disabled. The sum of the durations $t_{CW}$ and $t_{DT}$ is for example equal to the optical pulse period, in other words the period of the signal VCSEL.

The signal DN is for example asserted during the first half of the count window, and the signal UP is for example asserted during the second half of the count window. The signal VCSEL is for example the signal used to generate the transmitted optical pulses. The phase signal PHASE generated by the circuit 218 for example indicates the timing of the center of the count window for a subsequent returned optical pulse, based on the difference COUNT_SUM between the down and up counts. The phase signal PHASE' is for example generated in a similar fashion based on the timing of the center of the count window for reference optical pulses, and the difference in time between the phase signals PHASE and PHASE' is thus used to estimate the time of flight of the optical pulse from the image scene.

In the example of FIG. 3 the signal VCSEL is a square-wave signal, and the generated optical pulses for example also form a square-wave. However, in alternative embodiments, the signal VCSEL used to generate the optical pulses, and the optical pulses themselves, could have other forms. In some examples, the optical signal is a periodic optical signal. For example, the signal VCSEL and the optical pulses could form a continuous sinewave signal, having peaks that correspond to the optical pulses, and troughs in which the optical signal falls to zero. In such a case, the period of the optical pulse signal would be the period of the sinewave. As further examples, the signal VCSEL and the optical pulses could be in the form of triangle or sawtooth waves in which the peaks of these signals form the optical pulses. Of course, while the optical signal may be periodic, in some cases the period may vary from one cycle to the next, for example due to jitter, or because it has a varying pulse frequency over time.

The larger the target SPAD array 110, the greater its sensitivity to the received light from the image scene, and thus to the returned optical pulse. However, in high ambient light conditions, or in the case of highly reflective and/or close target objects, the number of events detected by the SPAD cells may overload the OR tree 202, leading to events being missed, and resulting in degradation in the accuracy of the range estimation.

Figure 4:
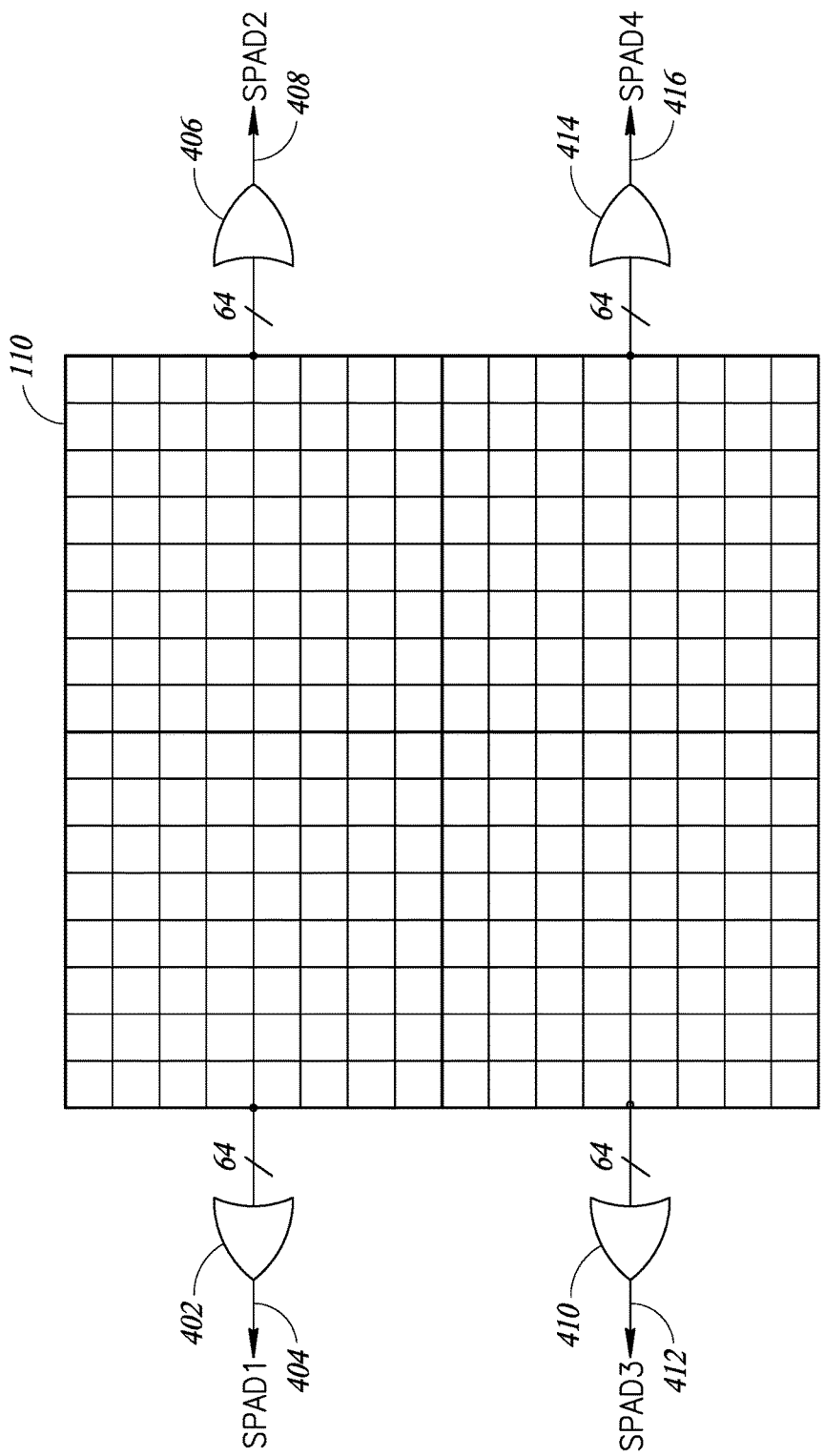
FIG. 4 schematically illustrates a SPAD array according to an example embodiment of the present disclosure.

FIG. 4 schematically illustrates the target SPAD array 110 and part of the read-out circuit according to an example embodiment that at least partially reduces the risk of overloading. The target SPAD array 110 for example comprises a 16×16 array of SPAD cells. The array is for example divided into four sub-arrays, each corresponding to a quadrant of the target array 110.

Each SPAD cell in the top left quadrant has its output coupled to an OR tree 402, which combines the signals from the SPAD cells to generate a signal SPAD1 on an output line 404. Similarly: each SPAD cell in the top right quadrant has its output coupled to an OR tree 406, which combines the signals to provide an output signal SPAD2 on an output line 408; each SPAD cell in the bottom left quadrant has its output coupled to an OR tree 410, which combines the signals to provide an output signal SPAD3 on an output line 412; and each SPAD cell in the bottom right quadrant has its output coupled to an OR tree 414, which combines the signals to provide an output signal SPAD4 on an output line 416.

While in the embodiment of FIG. 4 the SPAD array 110 is divided into four groups of SPAD cells and there are four OR trees respectively coupled to the outputs of the SPAD cells of each group, in alternative embodiments the SPAD cells of the SPAD array 110 could be divided into any plurality of groups coupled to a corresponding number of OR trees. Furthermore, while an example is illustrated in which the circuits for combining the SPAD outputs onto single lines are implemented by OR trees, in alternative embodiments, other logic circuits could be used.

Figure 5:
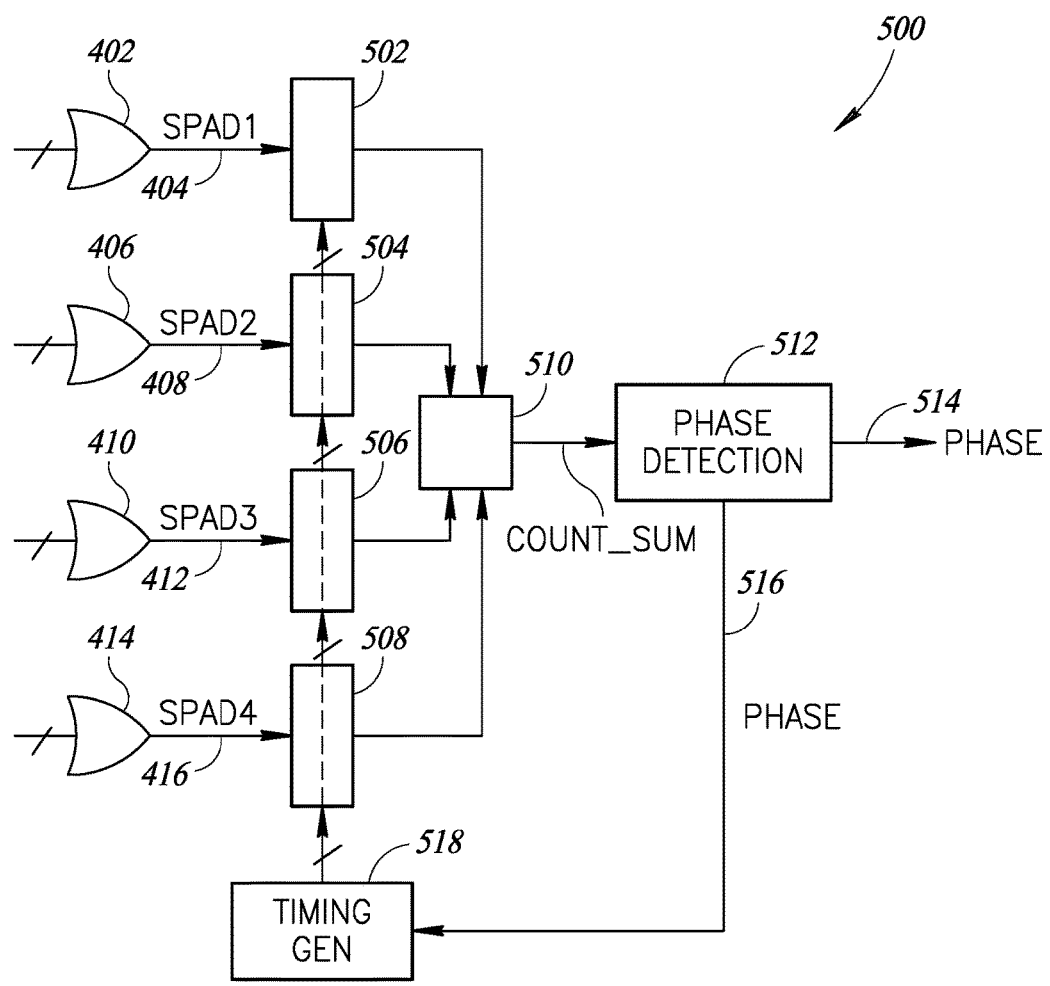
FIG. 5 schematically illustrates a read-out circuit of the SPAD array of FIG. 4 according to an example embodiment of the present disclosure.

FIG. 5 schematically illustrates a circuit 500 forming part of the delay detection circuit 114 of FIG. 1 according to an alternative embodiment to the circuit 200 of FIG. 2.

The circuit 500 comprises four counter circuits 502, 504, 506 and 508 respectively coupled to the outputs of the OR trees 402, 406, 410 and 414. Each of the circuits 502 to 508 is adapted to count, during down and up periods DN, UP, the photon detection events generated by the photon detection devices to which it is coupled via the corresponding OR tree 402, 406, 410, 414. The resulting count values are provided to an addition/subtraction circuit 510, which adds the DN count values and the UP count values, and determines the difference COUNT_SUM between the DN and UP count values. The difference COUNT_SUM is provided to a phase detection circuit (PHASE DETECTION) 512. Like the phase detection circuit 218 of FIG. 2, the phase detection circuit 512 is for example a sigma delta phase detector. The circuit 512 generates, based on the signal COUNT_SUM, the phase signal PHASE indicating the timing of the center of each optical pulse received by the target SPAD array 110. As represented by the feedback line 516, the phase signal PHASE generated by the circuit 512 is also for example transmitted to a timing generation circuit (TIMING GEN) 518, which generates control signals for controlling the timing of the counter circuits 502 to 508 based on the phase signal.

Figure 6:
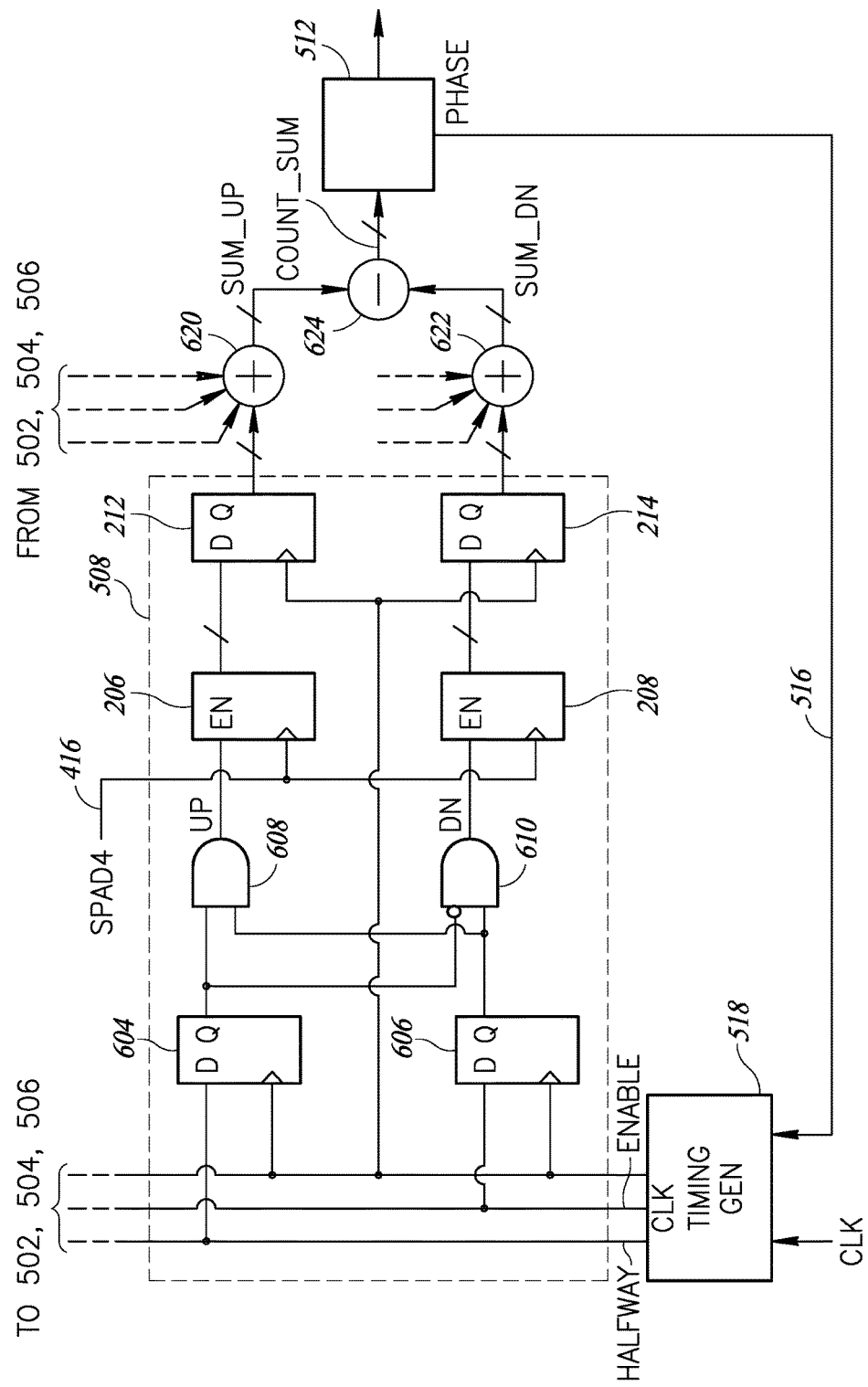
FIG. 6 schematically illustrates a counter circuit of the read-out circuit of FIG. 5 according to an example embodiment of the present disclosure.

FIG. 6 schematically illustrates the counter circuit 508, the addition/subtraction circuit 510, and the sigma-delta phase detection circuit 512 in more detail according to an example embodiment.

The timing generator (TIMING GEN) 518 for example receives the clock signal CLK, and generates control signals ENABLE and HALFWAY based on the clock signal. The control signals ENABLE and HALFWAY, and the clock signal CLK, are for example provided to each of the counter circuits 502, 504, 506 and 508.

The counter circuit 508 for example comprises a flip-flop 604 clocked by the clock signal CLK and having its data input coupled to receive the control signal HALFWAY, and a flip-flop 606 clocked by the clock signal CLK and having its data input coupled to receive the control signal ENABLE. The outputs of the flip-flops 604 and 606 are each coupled to corresponding inputs of an AND gate 608, which for example generates at its output the signal UP. The output of flip-flop 604 is also coupled to an inverted input of a further AND gate 610 and the output of flip-flop 606 is for example coupled to the other input of AND gate 610. The AND gate 610 for example generates the signal DN.

Like in the circuit of FIG. 2, the UP signal at the output of the AND gate 608 is coupled to an enable input of the counter 206, which has its clock input coupled to the line 416 for receiving the signal SPAD4. Similarly, the DN signal at the output of the AND gate 610 is coupled to an enable input of the counter 208, which has its clock input coupled to the line 416 for receiving the signal SPAD4.

The output of the counter 206 is for example clocked by the flip-flop 212 based on the clock signal CLK. Similarly, the output of the counter 208 is for example clocked by the flip-flop 214 based on the clock signal CLK.

The other counter circuits 502, 504, 506 are for example implemented by circuits similar to the circuit 508, except that the counters 206, 208 in the circuits 502, 504 and 506 respectively receive the signals SPAD1, SPAD2 and SPAD3.

The output of the flip-flop 212 is coupled to an adder 620 of the addition/subtraction circuit 510. The adder 620 also receives the corresponding outputs from the counter circuits 502 to 506, and adds all of the values together to provide an output count value SUM_UP. The output of the flip-flop 214 is coupled to an adder 622 of the addition/subtraction circuit 510. The adder 622 also receives the corresponding outputs from the counter circuits 502 to 506, and adds all of the values together to provide an output count value SUM_DN.

The addition/subtraction circuit 510 also for example comprises a subtractor 624, which for example subtracts the count value SUM_DN from the count value SUM_UP to generate the count value COUNT_SUM.

Figure 7:
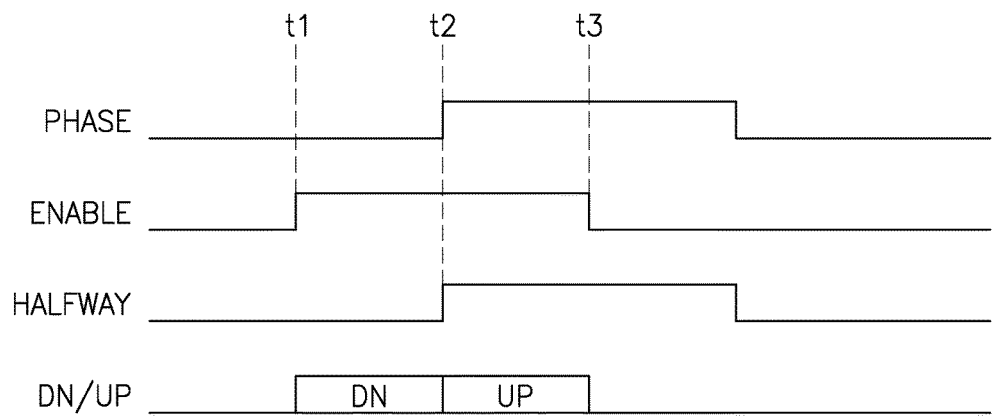
FIG. 7 is a timing diagram illustrating examples of the signals in the circuit of FIG. 6.

FIG. 7 is the timing diagram illustrating examples of the signal PHASE, the control signals ENABLE and HALFWAY, and the down/up signals DN/UP of the circuit of FIG. 6.

The signal HALFWAY for example rises halfway through a pulse in the ENABLE signal. For example, the signal ENABLE has a high pulse that goes high at time t1, and low at a time t3. The signal HALFWAY for example has a high pulse that goes high at the time t2, which is for example halfway between the times t1 and t3. The signal DN is asserted when the signal ENABLE and not the signal HALFWAY is asserted, and thus it is asserted between the times t1 and t2. The signal UP is asserted when both the signals ENABLE and HALFWAY are asserted, and thus it is asserted between the times t2 and t3.

Figure 8:
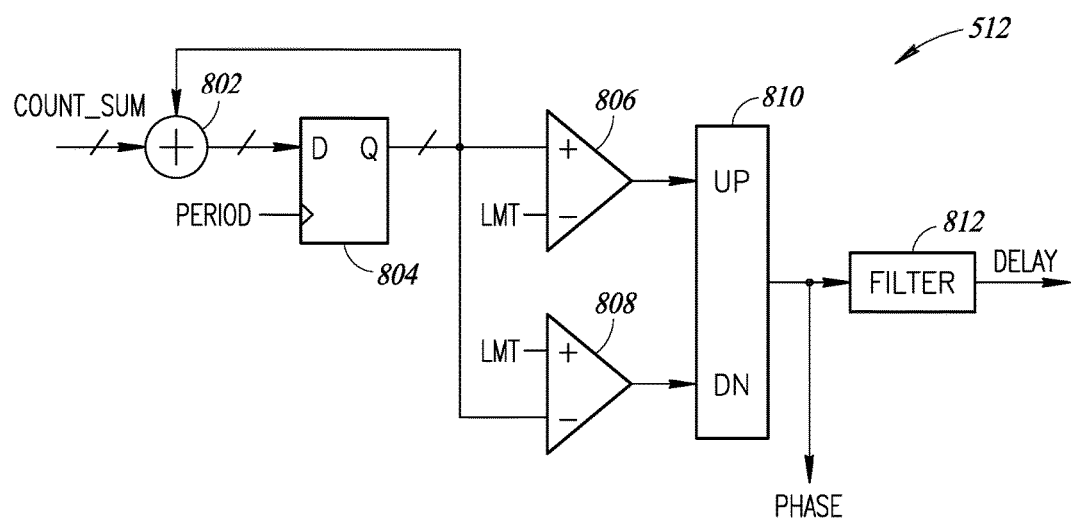
FIG. 8 schematically illustrates a phase detection circuit of the read-out circuit of FIG. 6 in more detail according to an example embodiment.

FIG. 8 illustrates the phase detection circuit 512 in more detail according to an example embodiment.

As illustrated, the output of the subtractor 624 providing the signal COUNT_SUM is for example coupled to an accumulator formed by an adder 802 and a flip-flop 804. The adder adds the value COUNT_SUM to a value at the output of the flip-flop 804, and provides the result to the input of the flip-flop 804. The flip-flop 804 is clocked by a clock signal PERIOD. The signal PERIOD for example has the same frequency as the optical pulses and the signals UP and DN. Thus, for each period of the optical signal, new UP/DN values are integrated by the accumulator formed by adder 802 and flip-flop 804. The output of the flip-flop 804 is coupled to a quantization circuit, which for example comprises a pair of comparators 806 and 808. The comparator 806 for example asserts a signal at its output if the output of the accumulator exceeds a limit LMT, whereas the comparator 808 for example asserts a signal at its output if the output of the accumulator is below the limit LMT. The outputs of the comparators 806, 808 are respectively coupled to an up input UP and a down input DN of a counter 810 providing the phase signal PHASE. The counter 810 for example increments the signal PHASE when the output of the comparator 806 is asserted, and decrements the signal PHASE when the output of the comparator 808 is asserted.

An advantage of the embodiments described herein is that congestion in a read-out circuit of a SPAD array can be avoided without a large increase in surface area of the read-out circuit. In particular, by providing a plurality of logic devices for combining outputs of groups of SPAD cells into a plurality of lines, and providing a counter circuit for each of these lines, congestion in the logic devices can be reduced.

Having thus described at least one illustrative embodiment, various alterations, modifications and improvements will readily occur to those skilled in the art. For example, while a specific implementation of the read-out circuit has been described, other implementations would be possible. Indeed, the sigma delta implementation of the phase detector is merely one example, and other implementations would be possible.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A ranging device comprising:
an array of photon detection devices configured to receive an optical signal reflected by an object in an image scene;
a first logic device coupled to a first plurality of the photon detection devices of the array, the first logic device configured to combine outputs of the first plurality of the photon detection devices;
a first counter circuit coupled to an output of the first logic device and configured to generate a first count value by counting photon detection events generated by the first plurality of photon detection devices during a first time window, and configured to generate a second count value by counting the photon detection events generated by the first plurality of photon detection devices during a second time window consecutive to the first time window;
a second logic device coupled to a second plurality of the photon detection devices of the array, the second logic device configured to combine outputs of the second plurality of the photon detection devices;
a second counter circuit coupled to an output of the second logic device and configured to generate a third count value by counting photon detection events generated by the second plurality of photon detection devices during the first time window, and configured to generate a fourth count value by counting the photon detection events generated by the second plurality of photon detection devices during the second time window; and
a range estimation circuit adapted to estimate a range of the object by estimating the timing of one or more pulses of said optical signal based on the first and second count values.

2. The ranging device of claim 1, further comprising:
a first adder adapted to add the first and third count values to generate a first combined count value; and a second adder adapted to add the second and fourth count values to generate a second combined count value, wherein the range estimation circuit is adapted to determine the timing of the one or more pulses based on the first and second combined count values.

3. The ranging device of claim 2, wherein the range estimation circuit is adapted to calculate the difference between the first and second combined count values, and to determine the timing of the one or more pulses based on said difference.

4. The ranging device of claim 1, wherein the range estimation circuit comprises a sigma-delta phase detector.

5. The ranging device of claim 1, further comprising:
an optical transmitter adapted to transmit the optical signal towards the object in the image scene.

6. The ranging device of claim 1, wherein the first and second logic devices are OR trees.

7. The ranging device of claim 1, wherein the photon detection devices are SPAD (single-photon avalanche diode) devices.

8. A method, comprising:
receiving, by an array of photon detection devices, an optical signal reflected by an object in an image scene;
combining, by a first logic device, the outputs of a first plurality of the photon detection devices;
generating, by a first counter circuit coupled to an output of the first logic device, a first count value by counting the photon detection events generated by the first plurality of photon detection devices during a first time window;
combining, by a second logic device, the outputs of a second plurality of the photon detection devices;
generating, by a second counter circuit coupled to an output of the second logic device, a second count value by counting the photon detection events generated by the second plurality of photon detection devices during the first time window;
estimating, by a range estimation circuit the range of the object by estimating the timing of one or more pulses of the optical signal based on the first and second count values;
generating a third count value by counting the photon detection events generated by the first plurality of photon detection devices during a second time window consecutive to the first time window; and
generating a fourth count value by counting the photon detection events generated by the second plurality of photon detection devices during the second time window.

9. The method of claim 8, further comprising:
adding the first and second count values to generate a first combined count value; and
adding the third and fourth count values to generate a second combined count value, wherein determining the timing of the one or more of pulses is based on the first and second combined count values.

10. The method of claim 9, further comprising calculating the difference between the first and second combined count values, and determining the timing of the one or more pulses based on said difference.

11. The method of claim 8, further comprising:
transmitting, by an optical transmitter, the optical signal towards the object in the image scene.

12. The method of claim 8, wherein the optical signal is:
a square-wave signal; or
a sinewave signal; or
a triangle wave signal; or
a sawtooth wave signal.

13. An electronic system, comprising:
a light source that generates an optical signal including a series of optical pulses;
a reference array that receives an internal reflection of each of the optical pulses and generates an output based on the received internal reflection of each optical pulse;
a target array of photon detection devices configured to receive an optical pulse reflected by an object in an image scene, each photon detection device generating a corresponding output responsive to a received optical pulse;
a delay detection circuit coupled to the reference array and the target array, the delay detection circuit including,
a read-out circuit configured to reduce a risk of overload by outputs from photon detection devices of the target array, the read-out circuit including,
a first logic device configured to combine the outputs of a first plurality of the photon detection devices;
a first counter circuit coupled to the first logic device and configured to generate a first count value by counting the photon detection events generated by the first plurality of photon detection devices;
a second logic device configured to combine the outputs of a second plurality of the photon detection devices;
a second counter circuit coupled to the second logic device and configured to generate a second count value by counting the photon detection events generated by the second plurality of photon detection devices; and
a range estimation circuit configured to estimate a range of the object by estimating the timing of one or more optical pulses of the optical signal using the first and second count values and the output of the reference array.

14. The electronic system of claim 13 wherein each of the reference array and target array comprises an array of single-photon avalanche diodes.

15. The electronic system of claim 14 wherein each of the first and second logic devices comprises an OR logic gate having a plurality of inputs, each input coupled to a respective single-photon avalanche diode in the array of single-photon avalanche diodes.

16. The electronic system of claim 15 wherein the first counter circuit comprises and up counter circuit and the second counter circuit comprises a down counter circuit.

17. The electronic system of claim 16 wherein the delay detection circuit further comprises a phase detection circuit that generates a phase signal indicating timing of the a center of each optical pulse received by the target array based on a difference an up-count generated by the up counter circuit and a down count generated by the down counter circuit.

18. The electronic system of claim 17 wherein the light source comprises a laser.

* * * * *